United States Patent
Huang et al.

(10) Patent No.: US 11,171,138 B2
(45) Date of Patent: Nov. 9, 2021

(54) SEMICONDUCTOR ARRANGEMENT AND METHOD OF MANUFACTURE

(71) Applicant: TAIWAN SEMICONDUCTOR MANUFACTURING COMPANY LIMITED, Hsin-Chu (TW)

(72) Inventors: Yu-Xuan Huang, Hsinchu (TW); Ching-Wei Tsai, Hsinchu (TW); Kuan-Lun Cheng, Hsin-Chu (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 16/695,293

(22) Filed: Nov. 26, 2019

(65) Prior Publication Data

US 2020/0176448 A1 Jun. 4, 2020

Related U.S. Application Data

(60) Provisional application No. 62/773,298, filed on Nov. 30, 2018.

(51) Int. Cl.
| | |
|---|---|
| *H01L 29/00* | (2006.01) |
| *H01L 27/092* | (2006.01) |
| *H01L 29/78* | (2006.01) |
| *H01L 29/66* | (2006.01) |
| *H01L 21/8238* | (2006.01) |
| *H01L 21/768* | (2006.01) |
| *H01L 23/535* | (2006.01) |

(52) U.S. Cl.
CPC .... *H01L 27/0924* (2013.01); *H01L 21/76846* (2013.01); *H01L 21/823821* (2013.01); *H01L 21/823871* (2013.01); *H01L 21/823892* (2013.01); *H01L 23/535* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | | | |
|---|---|---|---|---|
| 10,020,381 | B1* | 7/2018 | Fan | H01L 21/768 |
| 2018/0047727 | A1* | 2/2018 | Surisetty | H01L 29/41791 |
| 2018/0294267 | A1* | 10/2018 | Licausi | H01L 23/5286 |

* cited by examiner

*Primary Examiner* — Reema Patel
(74) *Attorney, Agent, or Firm* — Cooper Legal Group, LLC

(57) ABSTRACT

A semiconductor arrangement includes a well region, a transistor over the well region, a conductive line in conductive contact with a first source/drain region of the transistor and having a sidewall in conductive contact with a sidewall of the well region, and a liner layer disposed between the sidewall of the conductive line and the sidewall of the well region. A method includes forming a well region in a semiconductor layer. A first fin and a second fin are formed over the well region. A first spacer is formed on the first fin and a second spacer is formed on the second fin. A portion of the well region positioned between the first spacer and the second spacer is removed to define a trench. A liner layer is formed in the trench, and a conductive line is formed in the trench over the liner layer. The conductive line conductively contacts the well region.

20 Claims, 12 Drawing Sheets

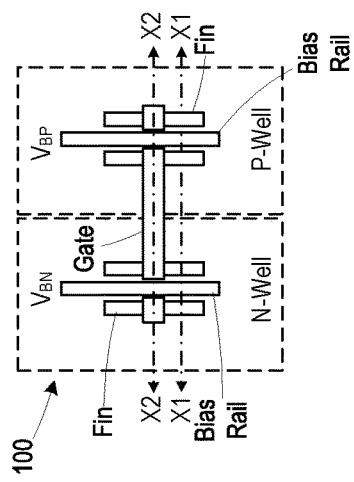
Figure 4
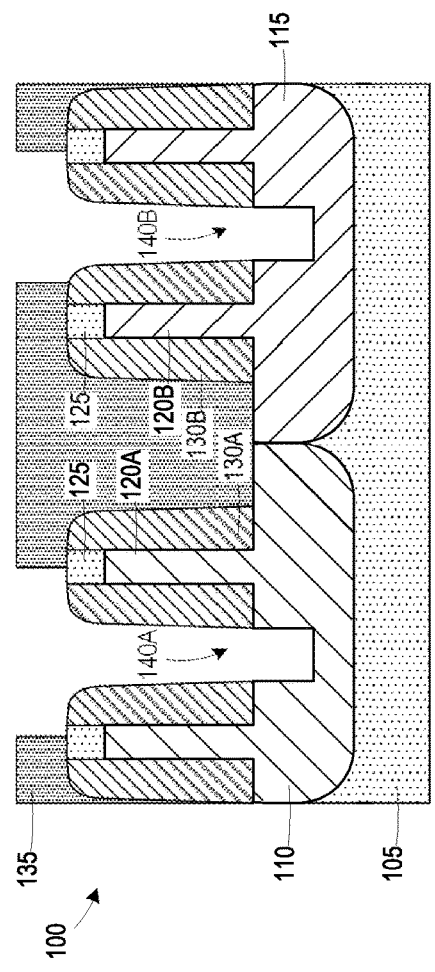
Figure 5
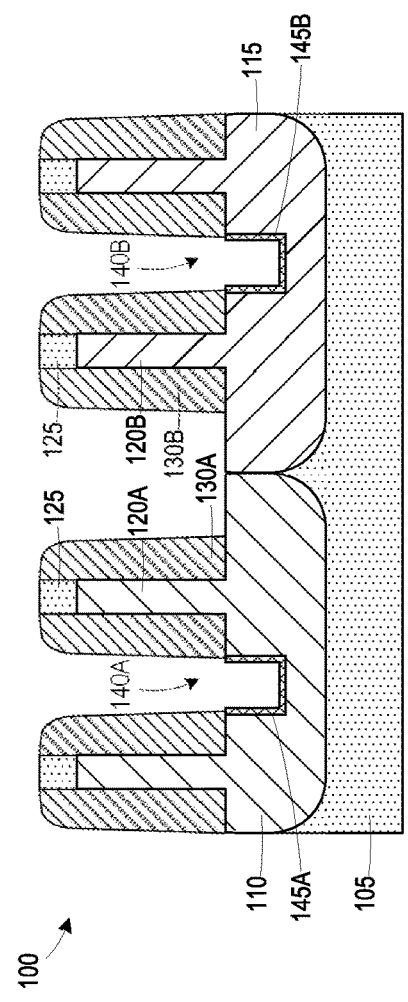

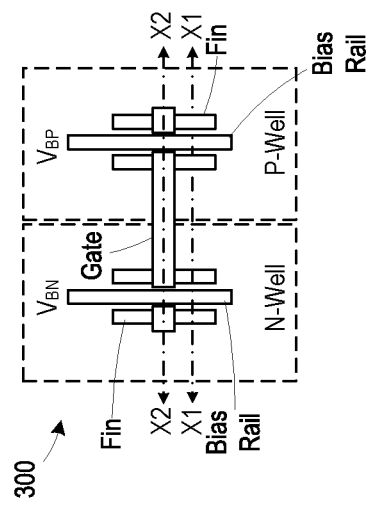
Figure 12
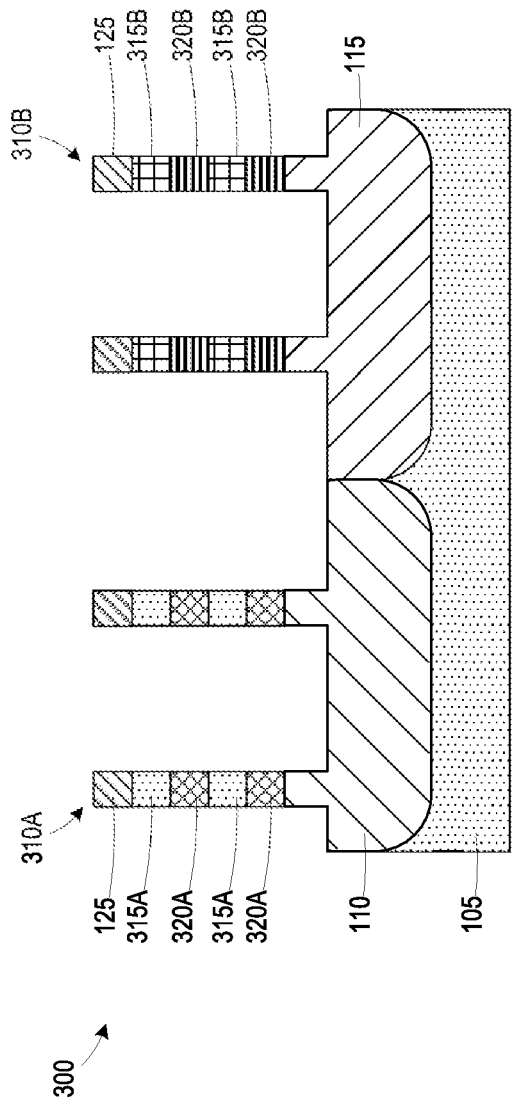
Figure 13
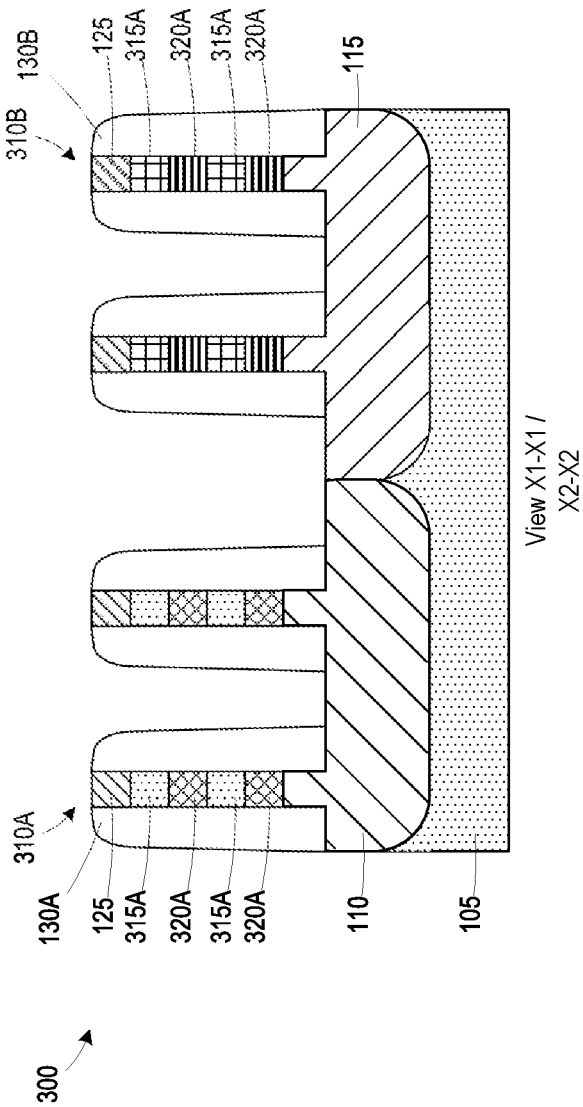

SEMICONDUCTOR ARRANGEMENT AND METHOD OF MANUFACTURE

RELATED APPLICATION

This application claims priority to U.S. Provisional Application Ser. No. 62/773,298, titled "SEMICONDUCTOR ARRANGEMENT AND METHOD OF MANUFACTURE" and filed on Nov. 30, 2018, which is incorporated herein by reference.

BACKGROUND

As the semiconductor industry has progressed into nanometer technology process nodes in pursuit of higher device density, higher performance, and lower costs, challenges from both fabrication and design issues have resulted in the development of three dimensional designs, such as a Fin Field Effect Transistor (FinFET) and Gate-All Around (GAA) transistors. A FinFET comprises an extended semiconductor fin that is elevated over a substrate in a direction substantially normal to a plane of a top surface of the substrate. A channel of the FinFET is formed in this extended semiconductor fin. A gate is provided over (e.g., wrapping) the fin. A GAA transistor comprises one or more nano-sheet or nano-wire channel regions having a gate wrapped around the nano-sheet or nano-wire. FinFETs and GAA transistors can reduce the short channel effect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-9 are illustrations of a semiconductor arrangement at various stages of fabrication, in accordance with some embodiments.

FIGS. 12-18 are illustrations of a semiconductor arrangement at various stages of fabrication, in accordance with some embodiments.

DETAILED DESCRIPTION

Figure 1A:
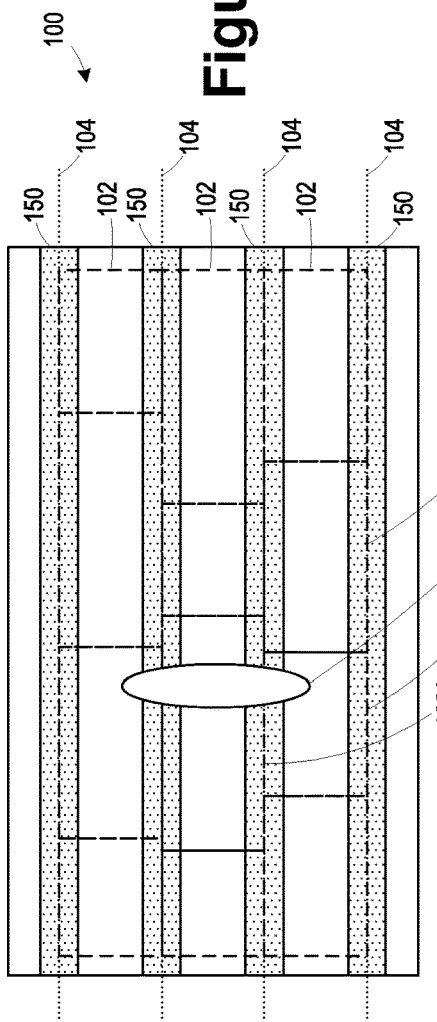
FIG. 1A illustrates a top-down view of a partial cell layout comprising a plurality of cells for performing logic functions, in accordance with some embodiments.

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for fabricating a semiconductor arrangement are provided herein. According to some embodiments, a semiconductor arrangement and method of forming a semiconductor arrangement are provided. In some embodiments, the semiconductor arrangement comprises a well region disposed within a semiconductor layer. In some embodiments, a first transistor is formed over the well region. In some embodiments, the first transistor is a Fin Field Effect Transistor (FinFET) comprising a fin. In some embodiments, the first transistor is a Gate-All Around (GAA) nano-sheet or nano-wire transistor. As used herein, nano-sheet refers to a substantially flat, nearly two-dimensional structure, and nano-wire refers to a structure having two-dimensions that are similar in magnitude. In some embodiments, a trench is defined by a portion of the well region adjacent to the first transistor. In some embodiments, a liner layer and a conductive line are formed in the trench and are electrically coupled to a power source. In some embodiments, the power source is ground. In some embodiments, the power source is a non-ground potential. In some embodiments, the power source comprises a bias voltage source. In some embodiments, a resistance between a first source/drain region of the first transistor and the conductive line is reduced by the presence of the liner layer between the well region and the conductive line to reduce a likelihood of latch-up occurring in the first transistor.

In some embodiments, cells within a chip are each configured to perform a logic function. Each cell may function as an inverter, a not-and (NAND) gate, a not-or (NOR) gate, a flip-flop, etc. and comprises electronic circuitry configured to enable the chip to perform the logic function. FIG. 1A illustrates a top-down view of a partial cell layout comprising a plurality of cells 102 of a semiconductor arrangement 100, in accordance with some embodiments. In some embodiments, the plurality cells 102 are arranged in rows. A boundary 104 between cells 102 of one row and cells 102 of an adjacent row may be referred to herein as a cell boundary. In some embodiments, conductive lines 150, also referred to herein as power rails or bias rails, are disposed at the cell boundaries 104 to provide power to the electronic circuitry of each cell 102.

Figure 1B:
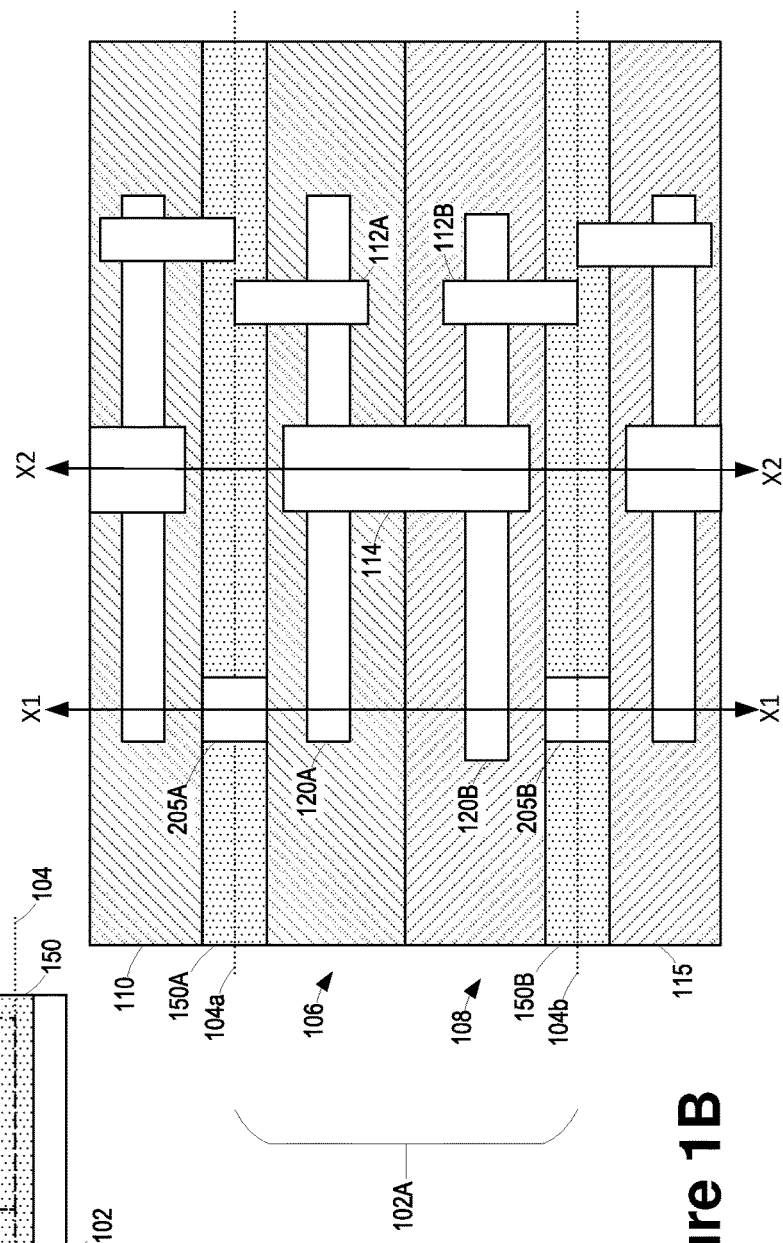
FIG. 1B illustrates an enlarged, top-down view of region A in FIG. 1A is illustrated, in accordance with some embodiments.

Referring to FIG. 1B, an enlarged, top-down view of region A in FIG. 1A is illustrated, in accordance with some embodiments. In some embodiments, a cell 102A of the plurality of cells 102, having a first cell boundary defined at the upper cell boundary 104a and a second cell boundary defined at a lower cell boundary 104b, comprises an N-region 106, defined by an N-well region 110, and a P-region 108, defined by a P-well region 115. In some embodiments, a first conductive line 150A of the conductive lines 150 is disposed in the N-well region 110 at the upper cell boundary 104a of the cell 102A, and a second conductive line 150B of the conductive lines 150 is disposed in the P-well region 115 at the lower cell boundary 104b of the cell 102A.

In some embodiments, a first fin 120A is disposed over the N-well region 110 in the N-region 106 and at least partially defines a first transistor of the cell 102A. In some embodiments, a second fin 120B is disposed over the P-well region 115 in the P-region 108 and at least partially defines a second transistor of the cell 102A. In some embodiments, a first source/drain region of the first transistor, which may be formed in the first fin 120A or formed above the first fin 120A, such as from an epitaxial region formed over a portion of the first fin 120A, is coupled to the first conductive line 150A by a contact 112A. In some embodiments, a first source/drain region of the second transistor, which may be formed in the second fin 120B or formed above the second fin 120B, such as from an epitaxial region formed over a portion of the second fin 120B, is coupled to the second conductive line 150B by a contact 112B. In some embodiments, the first conductive line 150A is coupled to a reference supply voltage, $V_{SS}$, through a contact 205A or the second conductive line 150B is coupled to the reference supply voltage, $V_{SS}$, through a contact 205B. In some embodiments, the first conductive line 150A is coupled to a power supply voltage, $V_{DD}$, through the contact 205A or the second conductive line 150B is coupled to the power supply voltage, $V_{DD}$, through the contact 205B.

In some embodiments, the first transistor and the second transistor share a common gate electrode 114 that separates the first source/drain region of the first transistor from a second source/drain region of the first transistor and also separates the first source/drain region of the second transistor from a second source/drain region of the second transistor. In some embodiments, a channel of the first transistor is defined in the first fin 120A under the gate electrode 114 and a channel of the second transistor is defined in the second fin 120B under the gate electrode 114. In some embodiments, the channel of the first transistor extends in a first direction between the first source/drain region of the first transistor and the second source/drain region of the first transistor. In some embodiments, the channel of the second transistor extends in the first direction between the first source/drain region of the second transistor and the second source/drain region of the second transistor. In some embodiments, the first conductive line 150A extends in the first direction such that the first conductive line 150A extends parallel to the first fin 120A. In some embodiments, the second conductive line 150B extends in the first direction such that the second conductive line 150B extends parallel to the second fin 120B.

FIGS. 2-9 are illustrations of the semiconductor arrangement 100 comprising the cell 102A at various stages of fabrication, in accordance with some embodiments. FIGS. 2-11 include a simplistic plan view showing where various cross-sectional views are taken. Referring to FIG. 1B, the views X1-X1 and X2-X2 illustrated in FIGS. 2-11 are cross-sectional views taken through the semiconductor arrangement 100 in a direction corresponding to a gate width direction. Not all aspects of the processing shown in the cross-sectional views will be depicted in the plan view.

Figure 2:
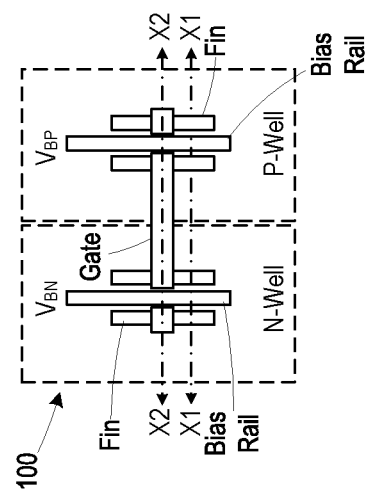

Referring to FIG. 2, the semiconductor arrangement 100 is illustrated, in accordance with some embodiments. In FIGS. 2-7 the structures shown in views X1-X1 and X2-X2 are the same, so only one view is shown. The semiconductor arrangement 100 comprises a semiconductor layer 105. In some embodiments, the semiconductor layer 105 comprises crystalline silicon. In some embodiments, the semiconductor arrangement 100 comprises the N-well region 110 and the P-well region 115 formed in the semiconductor layer 105. In some embodiments, the N-well region 110 is formed by masking the region of the semiconductor layer 105 where the P-well region 115 is to be formed, or where the P-well region 115 has already been formed, and performing an implantation process to implant dopants into the semiconductor layer 105. In some embodiments, the dopants implanted into the region of the semiconductor layer 105 where the N-well region 110 is to be formed comprise n-type dopants, such as phosphorous, arsenic, or other suitable n-type dopant. In some embodiments, the P-well region 115 is formed by masking the region of the semiconductor layer 105 where the N-well region 110 is to be formed, or where the N-well region 110 has already been formed, and performing an implantation process to implant dopants into the semiconductor layer 105. In some embodiments, the dopants implanted into the region of the semiconductor layer 105 where the P-well region 115 is to be formed comprise p-type dopants, such as boron, $BF_2$, or other suitable p-type dopant.

In some embodiments, the fins 120A, 120B are formed over the semiconductor layer 105. In some embodiments, the fins 120A, 120B are formed by forming a hard mask layer 125 over the semiconductor layer 105 after the N-well region 110 and the P-well region 115 have been formed and patterning the hard mask layer 125 to define a fin pattern. In some embodiments, trenches are etched in the semiconductor layer 105 using the patterned hard mask 125 as an etch template to form the fins 120A, 120B. Thus, in some embodiments, the first fin 120A is formed from an upper portion of the N-well region 110, and the second fin 120B is formed from an upper portion of the P-well region 115. In some embodiments, the fins 120A, 120B are grown over the semiconductor layer 105 instead of being formed from the P-well region 115 or N-well region 110 portions of the semiconductor layer 105. In general, the fins 120A, 120B define active regions for forming devices, such as FinFET transistors.

Figure 3:
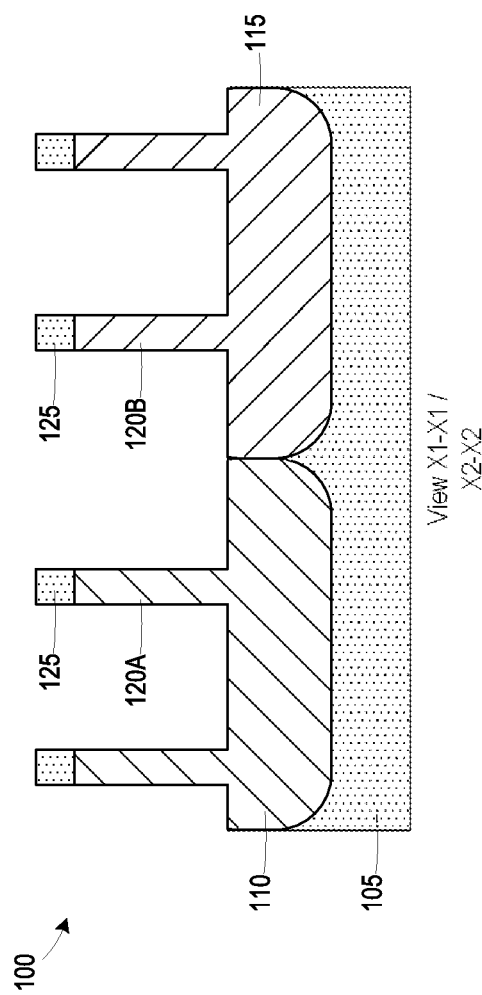

Referring to FIG. 3, sidewall spacers 130A, 130B are formed adjacent to the fins 120A, 120B, in accordance with some embodiments. In some embodiments, the sidewall spacers 130A, 130B are formed by forming a conformal spacer layer over the fins 120A, 120B and performing an anisotropic etch process to remove portions of the spacer layer positioned on horizontal surfaces of the hard mask layer 125 and the semiconductor layer 105. In some embodiments, the sidewall spacers 130A, 130B comprise the same material composition as the hard mask layer 125. In some embodiments, the sidewall spacers 130A, 130B comprises nitrogen and silicon or other suitable materials.

Referring to FIG. 4, a patterned mask layer 135 is formed over the hard mask layer 125, the fins 120A, 120B, and the sidewall spacers 130A, 130B, in accordance with some embodiments. In some embodiments, a trench 140A is formed in the N-well region 110 using the patterned mask layer 135 as an etch template, and a trench 140B is formed in the P-well region 115 using the patterned mask layer 135 as an etch template. In some embodiments, the sidewall spacers 130A, 130B are further used as an etch template during the etch process to form the trenches 140A, 140B. In some embodiments, such as where the patterned mask layer 135 exposes portions of the hard mask layer 125, the hard mask layer 125 also acts as part of the etch template. In some embodiments, the patterned mask layer 135 comprises photoresist. In some embodiments, the sidewall spacers 130A, 130B serve to self-align the etch process when forming the trenches 140A, 140B.

Referring to FIG. 5, the patterned mask layer 135 is removed and liner layers 145A, 145B are formed in the trenches 140A, 140B, in accordance with some embodiments. In some embodiments, the liner layer 145A is formed in the trench 140A to directly contact at least one of a sidewall of the N-well region 110 or a surface of the N-well region 110 underlying the liner layer 145A and defining a bottom of the trench 140A. In some embodiments, the liner layer 145B is formed in the trench 140B to directly contact at least one of a sidewall of the P-well region 115 or a surface of the P-well region 115 underlying the liner layer 145B and defining a bottom of the trench 140B.

In some embodiments, the liner layers 145A, 145B comprise metal seed layers, interface layers, adhesion layers, barrier layers, etc., or combinations of these layers. In some embodiments, the liner layers 145A, 145B comprise conductive layers, such as TiN, WN, TaN, Ru, W, Cu, Ti, Al, TiAl, TiAlN, TiAlC, TiAlCN, TaC, TaCN, TaSiN, Mn, Zr, or other suitable materials. In some embodiments, the liner layers 145A, 145B are formed in the trenches 140A, 140B by depositing a conformal layer of the material of the liner layers 145A, 145B over the semiconductor arrangement 100 and performing an etch process to remove portions of the conformal layer not positioned in the trenches 140A, 140B. In some embodiments, the liner layers 145A, 145B have a same material composition. In some embodiments, the material composition of the liner layer 145A is different than the material composition of the liner layer 145B. In some embodiments, where the liner layer 145A comprises a metal, the liner layer 145A and the N-well region 110 form a Schottky diode, with the liner layer 145A functioning as one of an anode or a cathode and the N-well region 110 functioning as the other of the anode or the cathode. In some embodiments, an interface where the liner layer 145A contacts the N-well region 110 may be referred to as a Schottky barrier. In some embodiments, where the liner layer 145B comprises a metal, the liner layer 145B and the P-well region 115 form a Schottky diode, with the liner layer 145B functioning as one of an anode or a cathode and the P-well region 115 functioning as the other of the anode or the cathode. In some embodiments, an interface where the liner layer 145B contacts the P-well region 115 may be referred to as a Schottky barrier.

In some embodiments, the liner layers 145A, 145B comprise silicide layers. In some embodiments, the silicide layers are formed by depositing a conformal layer of a refractory metal over the semiconductor arrangement 100 and performing an etch process to remove portions of the conformal layer not positioned in the trenches 140A, 140B. In some embodiments, the refractory metal comprises nickel, platinum, cobalt, or other suitable material. In some embodiments, different refractory metals are selected for each of the trenches 140A, 140B. In some embodiments, an annealing process is performed to cause the refractory metal to react with underlying silicon-containing material to form a metal silicide, and an etch process is performed to remove unreacted portions of the layer of refractory metal. In some embodiments, an additional annealing process is performed to form the final phase of the metal silicide. In some embodiments, the silicide formation process consumes some of the material of the semiconductor layer 105. In some embodiments, the liner layers 145A, 145B or precursors of the liner layers 145A, 145B are formed by a chemical vapor deposition (CVD) process, an atomic layer deposition (ALD) process, a physical vapor deposition (PVD) process, a plating process, an electroless plating process, or other suitable process.

Figure 6:
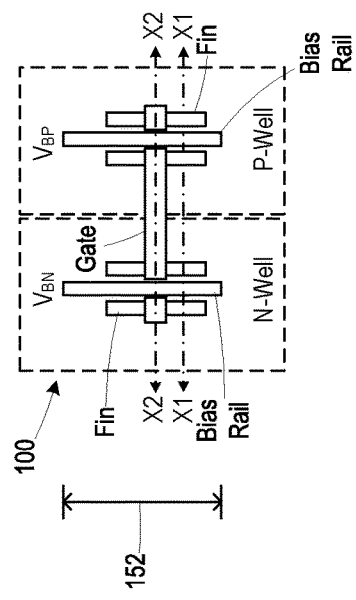

Referring to FIG. 6, conductive lines 150A, 150B are formed in the trenches 140A, 140B, in accordance with some embodiments. In some embodiments, the liner layer 145A is disposed between a bottom surface of the first conductive line 150A and the N-well region 110 upon the first conductive line 150A being formed. In some embodiments, the liner layer 145B is disposed between a bottom surface of the second conductive line 150B and the P-well region 115 upon the second conductive line 150B being formed. In some embodiments, at least a portion of a sidewall of the first conductive line 150A is in conductive contact with a sidewall of the N-well region 110, and at least a portion of a sidewall of the second conductive line 150B is in conductive contact with a sidewall of the P-well region 115. As used herein, the phrase conductive contact is intended to mean that the two elements that are in conductive contact are electrically coupled to one another such that current is capable of flowing from one of the elements that are in conductive contact to another one of the elements that are in conductive contact. The two elements may or may not be in direct physical contact with each other.

In some embodiments, the conductive lines 150A, 150B are formed by depositing a conductive layer over the semiconductor arrangement 100 and performing an etch process to recess the conductive material. In some embodiments, the conductive material comprises tungsten, aluminum, copper, cobalt, or another suitable material. In some embodiments, the conductive material is formed by a CVD process, an ALD process, a PVD process, a plating process, an electroless plating process, or other suitable process. In some embodiments, a portion of at least one of the conductive lines 150A, 150B extends beyond the trenches 140A, 140B such that a top surface of the at least one the conductive lines 150A, 150B is above a top surface of the semiconductor layer 105. In some embodiments, at least one of the conductive lines 150A, 150B is recessed relative to the top surface of the semiconductor layer 105 such that the top surface of the at least one of the conductive lines 150A, 150B is below the top surface of the semiconductor layer 105. In some embodiments, the top surface of at least one of the conductive lines 150A, 150B is coplanar with the top surface of the semiconductor layer 105. In some embodiments, the conductive lines 150A, 150B have a width 151 of about 5-100 nm. In some embodiments, a bottom surface of at least one of the conductive lines 150A, 150B is spaced apart from a top surface of the semiconductor layer 105 by about 0-200 nm. In some embodiments, the bottom surface of at least one of the conductive lines 150A, 150B is spaced apart from the top surface of the semiconductor layer 105 by about 50-100 nm. In some embodiments, the spacing between the bottom surface of the at least one of the conductive lines 150A, 150B and the top surface of the semiconductor layer 105 selected is based upon constraints in the width 151 of the at least one of the conductive lines 150A, 150B due to a desired spacing between fins 120A, 120B, and a desired conductivity of the at least one of the conductive lines 150A, 150B. In some embodiments, the spacing between the bottom surface of the at least one of the conductive lines 150A, 150B and the top surface of the semiconductor layer 105 selected is based upon at least one of constraints in the width 151 of the at least one of the conductive lines 150A, 150B due to a desired spacing between fins 120A, 120B, the manufacturing process(es) used to form the trenches 140A, 140B, the material composition of the conductive lines 150A, 150B, or the manufacturing process(es) used to form the conductive lines 150A, 150B. For example, in some embodiments, the trenches 140A, 140B are tapered due to the manufacturing process(es) used to form the trenches 140A, 140B. If a width at a bottom of the trenches 140A, 140B is too narrow, the material(s) of the conductive lines 150A, 150B may pitch-off during the manufacturing process(es) used to form the conductive lines 150A, 150B, which may result in resistance being introduced into the conductive lines 150A, 150B due to air-gaps formed where the conductive lines 150A, 150B pitched-off in the trenches 140A, 140B. In some embodiments, a portion of the first conductive line 150A at least partially overlies the liner layer 145A. In some embodiments, a portion of the second conductive line 150B at least partially overlies the liner layer 145B. In some embodiments, a portion of the first conductive line 150A, such as at least one of a sidewall or a bottom surface of the first conductive line 150A directly contacts the liner layer 145A. In some embodiments, a portion of the second conductive line 150B, such as at least one of a sidewall or a bottom surface of the second conductive line 150B directly contacts the liner layer 145B.

Figure 7:
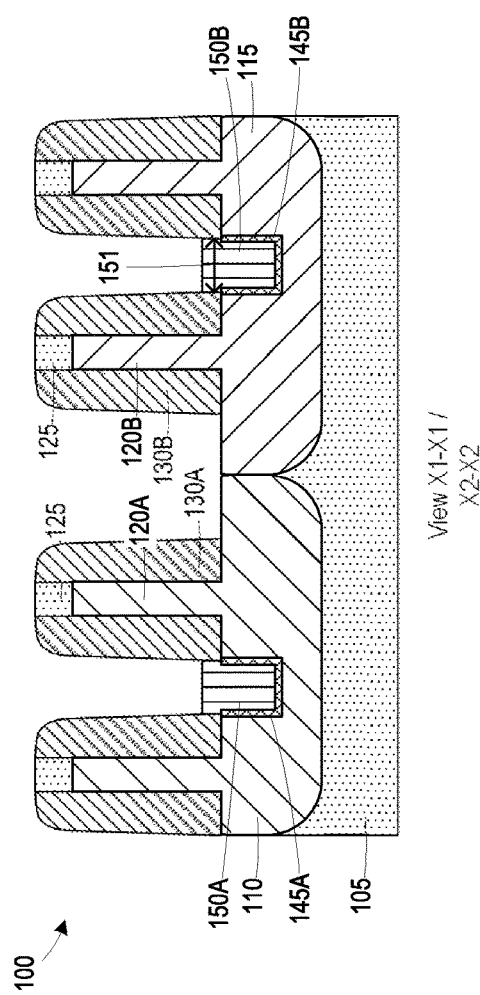

Referring to FIG. 7, the hard mask layer 125 and the sidewall spacers 130A, 130B are removed and an isolation structure 155, such as a shallow trench isolation (STI), is formed between the fins 120A, 120B, in accordance with some embodiments. In some embodiments, an etch process is performed to remove the hard mask layer 125 and the sidewall spacers 130A, 130B. In some embodiments, the isolation structure 155 is formed by depositing a dielectric layer between the fins 120A, 120B and recessing the dielectric layer by performing an etch process to expose at least portions of the sidewalls of the fins 120A, 120B that were concealed when the dielectric layer was deposited. In some embodiments, the isolation structure 155 comprises silicon and oxygen. In some embodiments, such as illustrated in FIG. 7, the isolation structure 155 is disposed layer between the first conductive line 150A and the first fin 120A. In some embodiments, such as illustrated in FIG. 7, the isolation structure 155 is disposed layer between the second conductive line 150B and the second fin 120B.

In some embodiments, a barrier layer 160 (shown in phantom in FIG. 7, but not repeated in the subsequent Figures) is formed over the exposed portion of at least one of the conductive lines 150A, 150B prior to forming the isolation structure 155. In some embodiments, the use of the barrier layer 160 depends on the material of the conductive lines 150A, 150B and the material of the isolation structure 155. In some embodiments, the barrier layer 160 is deposited over the semiconductor arrangement 100, and an etch process is performed to remove portions of the barrier layer 160 not positioned over the at least one of the conductive lines 150A, 150B. In some embodiments, the barrier layer 160 comprises at least one of TiN, TaN, or other suitable material.

Figure 8:
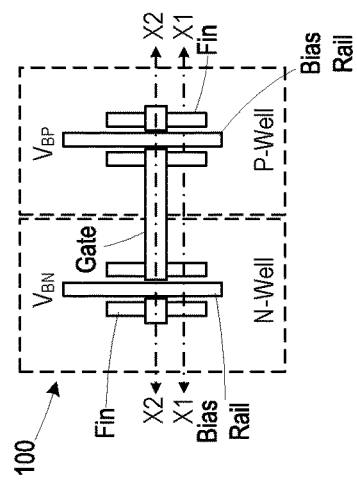
Figure 8:
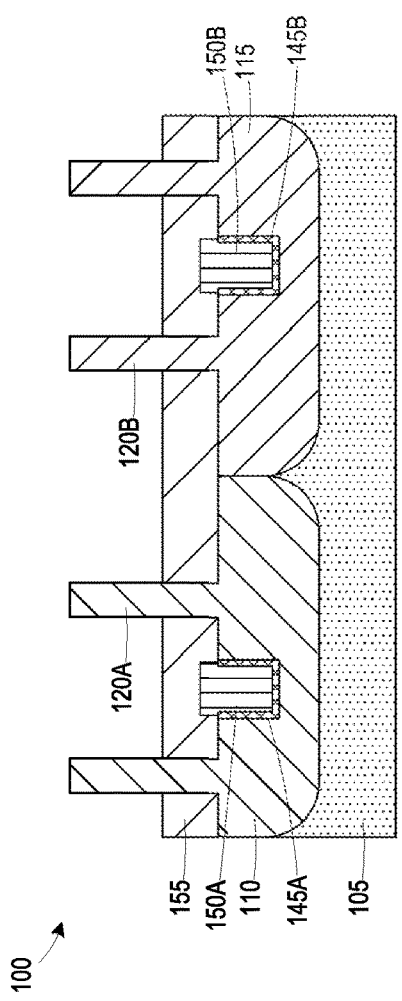
Figure 8:
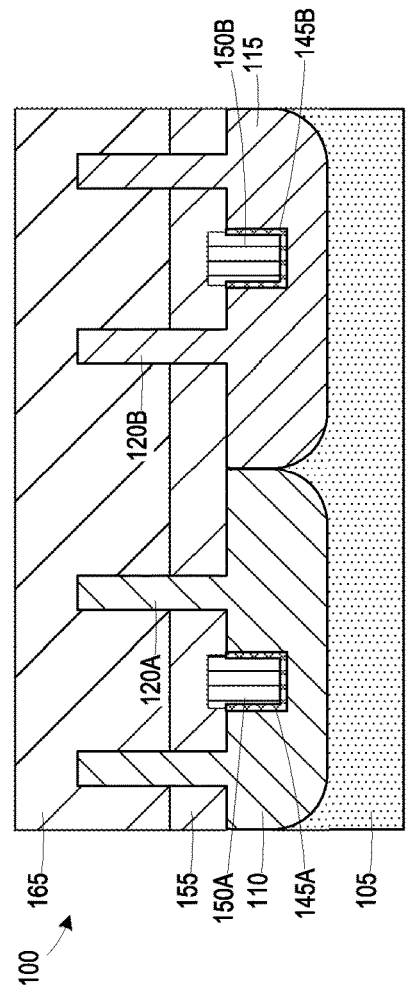
Figure 9:
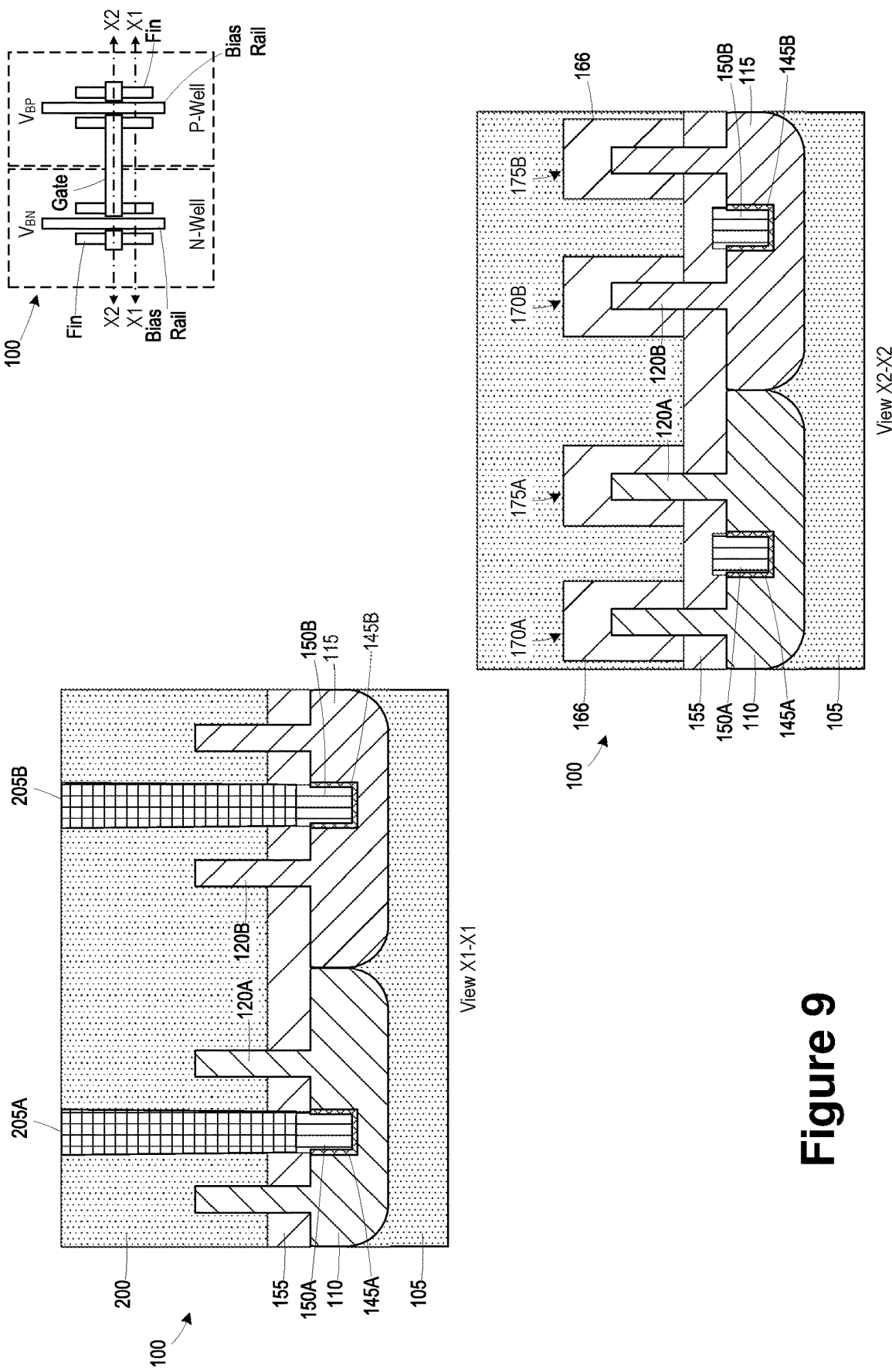

Referring to FIG. 8, a dummy gate structure 165 is formed over a portion of the fins 120A, 120B, such as over a channel portion of the fins 120A, 120B, and over a portion of the isolation structure 155, in accordance with some embodiments. According to some embodiments, the dummy gate structure 165 is formed by forming a sacrificial gate dielectric layer and a layer of sacrificial polysilicon material over the fins 120A, 120B and the isolation structure 155. In some embodiments, in accordance with a gate last or replacement gate process, various processes associated with the semiconductor device, including at least one of patterning processes, deposition processes, implantation processes, or growth processes, are performed after the dummy gate structure 165 is formed to form gate spacers and source/drain regions and to define one or more gate structures 166, such as metal gate structures, over the portion of the fins 120A, 120B, as illustrated in FIG. 9. In some embodiments, the fins 120A, 120B and gate structures 166 form transistors 170A, 170B, 175A, 175B. As further illustrated in FIG. 9, in some embodiments, due to the dummy gate structure 165 being formed over the isolation structure 155, the isolation structure 155 is disposed between the gate structures 166 and the first conductive line 150A and between the gate structures 166 and the second conductive line 150B.

Referring to FIG. 9, a dielectric layer 200 is formed over the fins 120A, 120B, and contacts 205A, 205B are formed in the dielectric layer 200, in accordance with some embodiments. In some embodiments, the contacts 205A, 205B are electrically connected to the conductive lines 150A, 150B. In some embodiments, the dielectric layer 200 comprises silicon dioxide or a low-k material. In some embodiments, the dielectric layer 200 comprises one or more layers of low-k dielectric material. Low-k dielectric materials have a k-value (dielectric constant) lower than about 3.9. Some low-k dielectric materials have a k-value lower than about 3.5 and may have a k-value lower than about 2.5. The materials for the dielectric layer 200 comprise at least one of Si, O, C, or H, such as SiCOH and SiOC, or other suitable materials. Organic material, such as polymers, may be used for the dielectric layer 200. In some embodiments, the dielectric layer 200 comprises one or more layers of a carbon-containing material, organo-silicate glass, or a porogen-containing material. The dielectric layer 200 comprises nitrogen in some embodiments. The dielectric layer 200 may be formed by using, for example, at least one of plasma-enhanced chemical vapor deposition (PECVD), low pressure CVD (LPCVD), atomic layer CVD (ALCVD), or a spin-on technology. In some embodiments where the dielectric layer 200 is formed using PECVD, the dielectric layer 200 is deposited at a substrate temperature in a range of about 25° C. to about 400° C. and at a pressure of less than 100 Torr. In some embodiments, the contacts 205A, 205B are formed by forming contact openings in the dielectric layer 200 and forming one or more layers of material in the contact openings. In some embodiments, the contact openings are formed by performing an etch process using a patterned etch mask formed over the dielectric layer 200. In some embodiments, the layers of the contacts 205A, 205B comprise metal seed layers, interface layers, adhesion layers, barrier layers, conductive material fill layers, etc., or combinations of these layers. In some embodiments, the layers of the contacts 205A, 205B comprise conductive layers, such as TiN, WN, TaN, Ru, W, Cu, Co, Ti, Al, TiAl, TiAlN, TiAlC, TiAlCN, TaC, TaCN, TaSiN, Mn, Zr, or other suitable materials. In some embodiments, the layers of the contacts 205A, 205B are formed by CVD processes, ALD processes, PVD processes, plating processes, electroless plating processes, combinations of these processes, or other suitable process.

Figure 10:
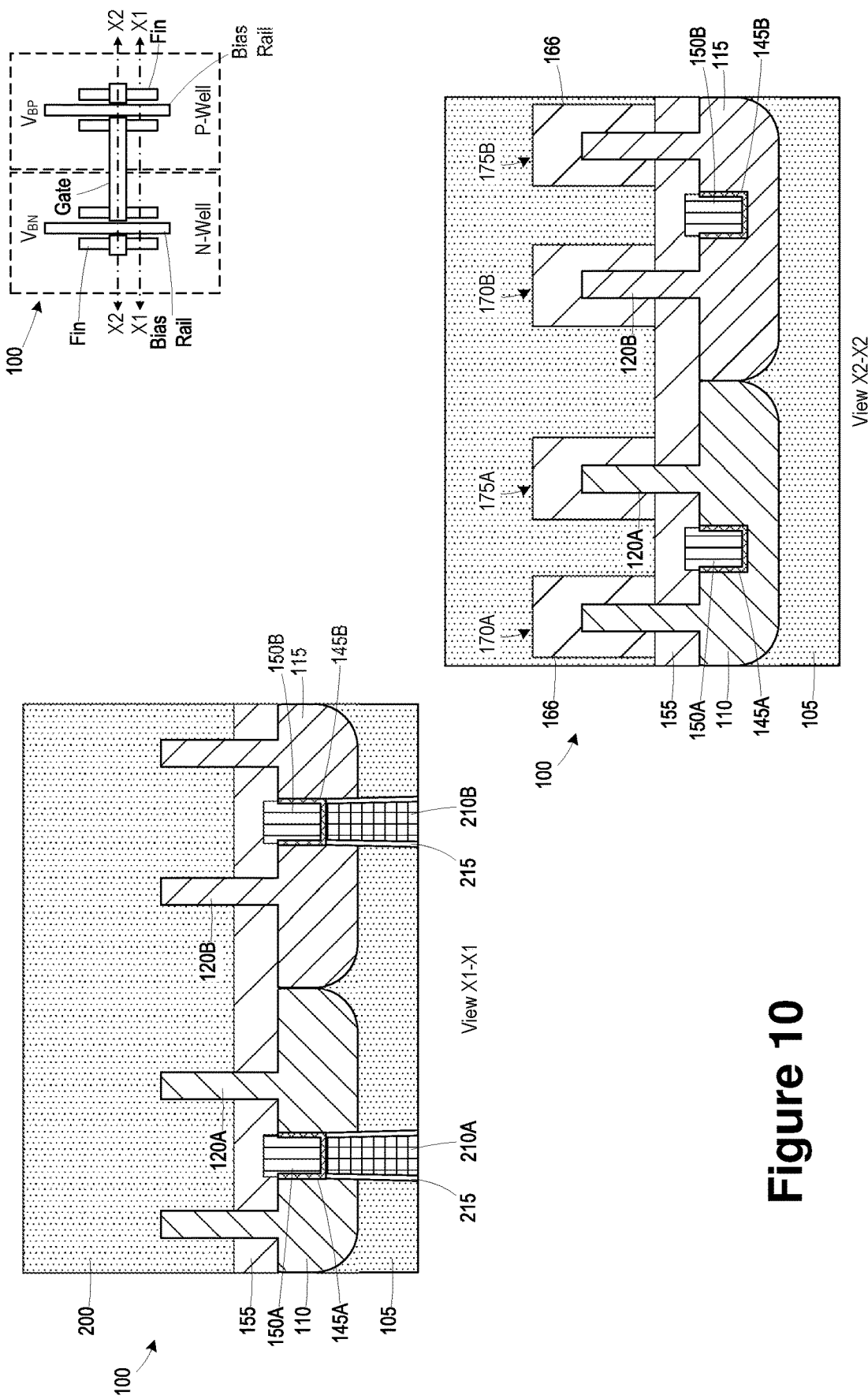
FIG. 10 is an illustration of a semiconductor arrangement, in accordance with some embodiments.

Referring to FIG. 10, the semiconductor arrangement 100 comprises the dielectric layer 200 formed over the fins 120A, 120B and backside contacts 210A, 210B formed in the semiconductor layer 105 and electrically coupled to the conductive lines 150A, 150B, in accordance with some embodiments. In some embodiments, the backside contacts 210A, 210B are formed by forming contact openings in the semiconductor layer 105, forming dielectric spacers 215 in the contact openings, and forming one or more layers of the backside contacts 210A, 210B in the contact openings. In some embodiments, the contact openings are formed by performing an etch process using a patterned etch mask formed on the back surface of the semiconductor layer 105. In some embodiments, the dielectric spacers 215 are formed by forming a conformal spacer layer in the contact openings and on the back surface of the semiconductor layer 105 and performing an anisotropic etch process to remove portions of the spacer layer positioned on horizontal surfaces of the semiconductor layer 105 and at the bottom of the contact openings to expose the conductive lines 150A, 150B. In some embodiments, the backside contact 210A extends through the N-well region 110 and contacts the liner layer 145A. In some embodiments, the backside contacts 210B extends through the P-well region 115 and contacts the liner layer 145B. In some embodiments, an additional etch process is performed to form an opening in the liner layers 145A, 145B. In some embodiments, such as where the liner layers 145A, 145B comprise a metal silicide, an opening is not formed in the liner layers 145A, 145B. In some embodiments, the dielectric spacers 215 comprise nitrogen and silicon. In some embodiments, the dielectric spacers 215 comprise oxygen and silicon. In some embodiments, the layers of the backside contacts 210A, 210B comprise metal seed layers, interface layers, adhesion layers, barrier layers, conductive material fill layers, etc., or combinations of these layers. In some embodiments, the layers of the backside contacts 210A, 210B comprise conductive layers, such as TiN, WN, TaN, Ru, W, Cu, Co, Ti, Al, TiAl, TiAlN, TiAlC, TiAlCN, TaC, TaCN, TaSiN, Mn, Zr, or other suitable materials. In some embodiments, the layers of the backside contacts 210A, 210B are formed by CVD processes, ALD processes, PVD processes, plating processes, electroless plating processes, combinations of these processes, or other suitable process.

In some embodiments, the first conductive line 150A is connected to a first voltage source to bias the N-well region 110, and the second conductive line 150B is connected to a second voltage source to bias the P-well region 115. In some embodiments, a neutral bias is applied to the transistors 170A, 170B, 175A, 175B in the semiconductor arrangement 100 by coupling the first conductive line 150A in the N-well region 110 to a reference supply voltage, $V_{SS}$, and coupling the second conductive line 150B in the P-well region 115 to a power supply voltage, $V_{DD}$. In some embodiments, the reference supply voltage, $V_{SS}$, comprises ground. In some embodiments, a back bias is applied to the transistors 170A, 170B, 175A, 175B in the semiconductor arrangement 100 by coupling the first conductive line 150A in the N-well region 110 to a first bias voltage source, $V_{BIASP}$, and coupling the second conductive line 150B in the P-well region 115 to a second bias voltage source, $V_{BIASN}$. In some embodiments, a reverse back bias is applied by providing $V_{BIASP}$ at a voltage level above $V_{DD}$ or providing $V_{BIASN}$ at a negative voltage level less than $V_{SS}$ or both. In some embodiments, a forward back bias is applied by providing $V_{BIASP}$ at a voltage level less than $V_{DD}$ including a negative voltage or providing $V_{BIASN}$ at a voltage level greater than $V_{SS}$ or both. In some embodiments, the provision of a forward back bias decreases a threshold voltage of the transistors 170A, 170B, 175A, 175B relative to the threshold voltage at the neutral bias condition. In some embodiments, the provision of a forward back bias increases a threshold voltage of the transistors 170A, 170B, 175A, 175B relative to the threshold voltage at the neutral bias condition.

Figure 11:
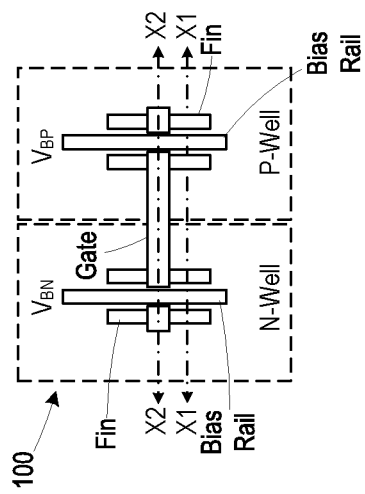
FIG. 11 is an illustration of a semiconductor arrangement, in accordance with some embodiments.
Figure 11:
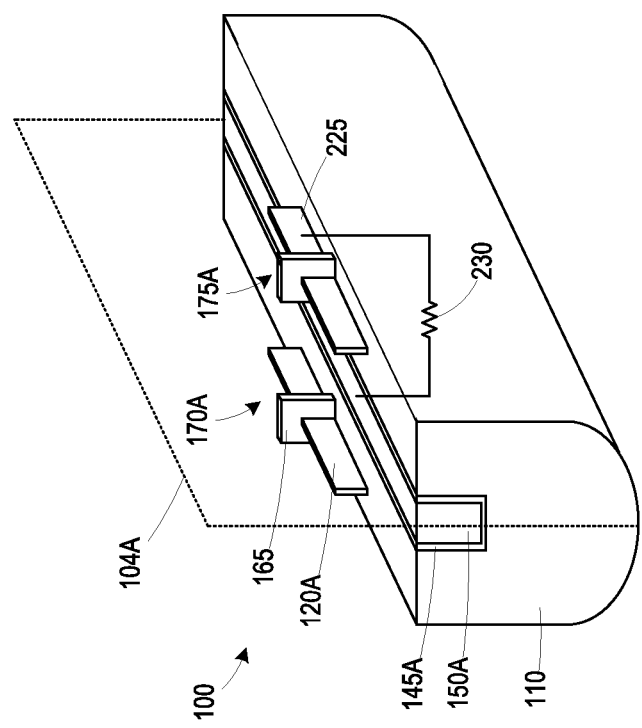

Referring to FIG. 11, an isometric view of a portion of the semiconductor arrangement 100 showing the fins 120A, 120B and the N-well region 110 is provided, in accordance with some embodiments. In the embodiment illustrated in FIG. 10, a top surface of the first conductive line 150A is coplanar with a top surface of the semiconductor layer 105 comprising the N-well region 110. In some embodiments, the first conductive line 150A is positioned at the cell boundary 104A, where the transistor 170A formed on the left of the cell boundary 104A is included in one cell, and the transistor 175A formed on the right of the cell boundary 104A is included in the cell 102A. In some embodiments, where the liner layers 145A, 145B comprise silicide material, an ohmic connection is formed between the first conductive line 150A and the N-well region 110 and between the second conductive line 150B and the P-well region 115. In some embodiments, a Schottky connection is formed at least one of between the liner layer 145A and the N-well region 110 or between the liner layer 145B and the P-well region 115. A Schottky connection between a metal and a semiconductor material functions as a low forward voltage drop diode. In some embodiments, a well resistance exists between the first conductive line 150A and a source/drain region 225 of the transistor 175A, represented by a resistor 230. In semiconductor devices, a latch-up can occur when a low-impedance path is created between the $V_{DD}$ and $V_{SS}$ rails due to interaction of parasitic PNP and NPN bipolar transistors that form a silicon-controlled rectifier with positive feedback that can short circuit the power rail and the ground rail. In some embodiments, reducing the well resistance by providing the liner layers between the well regions 110, 115 and the conductive lines 150A, 150B reduces the likelihood of a latch-up condition occurring. In some embodiments, the presence of the liner layers 145A, 145B between the well regions 110, 115 and the conductive lines 150A, 150B obviate the need for pickup cells to connect voltage sources to the N-well region 110 and the P-well region 115, resulting in a reduced cell area. In some embodiments, a total number of pickup cells within a chip is reduced by 90% or more because the presence of the liner layers 145A, 145B between the well regions 110, 115 and the conductive lines 150A, 150B inhibit low-impedance paths from being created between the $V_{DD}$ and $V_{SS}$ rails and thereby inhibit latch-up conditions from occurring.

FIGS. 12-18 are illustrations of a semiconductor arrangement 300 at various stages of fabrication, in accordance with some embodiments. FIGS. 12-18 include a simplistic plan view showing where various cross-sectional views are taken. Referring to FIG. 12, the views X1-X1 and X2-X2 are cross-sectional views taken through the semiconductor arrangement 300 in a direction corresponding to a gate width direction. Not all aspects of the processing shown in the cross-sectional views will be depicted in the plan view.

Referring to FIG. 12, a plurality of layers used in the formation of the semiconductor arrangement 300 is illustrated, in accordance with some embodiments. In some embodiments, the semiconductor arrangement 300 comprises nano-structure based transistors. Nano-structure is used herein to refer to substantially flat, nearly two-dimensional structures, such as sometimes referred to as nano-sheets, as well as structures having two-dimensions that are similar in magnitude, such as sometimes referred to as nano-wires.

The semiconductor arrangement 300 comprises a semiconductor layer 105. In some embodiments, the semiconductor layer 105 comprises crystalline silicon. In some embodiments, the semiconductor arrangement 300 comprises an N-well region 110 and a P-well region 115 formed in the semiconductor layer 105. In some embodiments, the N-well region 110 is formed by masking the region of the semiconductor layer 105 where the P-well region 115 is to be formed, or where the P-well region 115 has already been formed, and performing an implantation process to implant dopants into the semiconductor layer 105. In some embodiments, the dopants implanted into the region of the semiconductor layer 105 where the N-well region 110 is to be formed comprise n-type dopants, such as phosphorous, arsenic, or other suitable n-type dopant. In some embodiments, the P-well region 115 is formed by masking the region of the semiconductor layer 105 where the N-well region 110 is to be formed, or where the N-well region 110 has already been formed, and performing an implantation process to implant dopants into the semiconductor layer 105. In some embodiments, the dopants implanted into the region of the semiconductor layer 105 where the P-well region 115 is to be formed comprise p-type dopants, such as boron, $BF_2$, or other suitable p-type dopant.

In some embodiments, fins 310A, 310B are formed over the N-well region 110 and the P-well region 115 by forming a stack of semiconductor material layers, forming a hard mask layer 125 over the stack of semiconductor material layers, patterning the hard mask layer 125, and using the hard mask layer 125 as an etch template to each the stack of semiconductor material layers to define the fins 310A, 310B. In some embodiments, the fins 310A, 310B comprises active semiconductor material layers 315A, 315B and sacrificial semiconductor layers 320A, 320B. In some embodiments, the materials of the active semiconductor material layers 315A, 315B are different than the materials of the sacrificial semiconductor layers 320A, 320B to provide etch selectivity and allow removal of the sacrificial semiconductor layers 320A, 320B.

In some embodiments, the active semiconductor material layers 315A, 315B comprise the same material composition and the sacrificial semiconductor layers 320A, 320B comprise the same material composition. In some embodiments, the active semiconductor material layers 315A, 315B comprise substantially pure silicon, and the sacrificial semiconductor layers 320A, 320B comprise silicon-germanium, such as $Si_xGe_{(1-x)}$, where x ranges from 0.25 to 0.85.

In some embodiments, the active semiconductor material layers 315A, 315B are different materials and the sacrificial semiconductor layers 320A, 320B are different materials. In some embodiments, the active semiconductor material layers 315A comprise substantially pure silicon, and the active semiconductor material layers 315B comprise silicon-germanium, such as $Si_xGe_{(1-x)}$, where x ranges from 0.25 to 0.85. In some embodiments, the sacrificial semiconductor layers 320A, 320B comprise different alloy concentrations of Ge to provide etch selectivity with respect to the active semiconductor material layers 315A, 315B.

In some embodiments, the number of active semiconductor material layers 315A, 315B and sacrificial semiconductor layers 320A, 320B is more than two. In some embodiments, the order of the active semiconductor material layers 315A, 315B and sacrificial semiconductor layers 320A, 320B vary. In some embodiments, thicknesses of the active semiconductor material layers 315A, 315B and sacrificial semiconductor layers 320A, 320B vary, and the thicknesses need not be the same.

Referring to FIG. 13, sidewall spacers 130A, 130B are formed adjacent to the fins 310A, 310B, in accordance with some embodiments. In some embodiments, the sidewall spacers 130A, 130B are formed by forming a conformal spacer layer over the fins 310A, 310B and performing an anisotropic etch process to remove portions of the spacer layer positioned on horizontal surfaces of the hard mask layer 125 and the semiconductor layer 105. In some embodiments, the sidewall spacers 130A, 130B comprise the same material composition as the hard mask layer 125. In some embodiments, the sidewall spacers 130A, 130B comprises nitrogen and silicon or other suitable materials.

Figure 14:
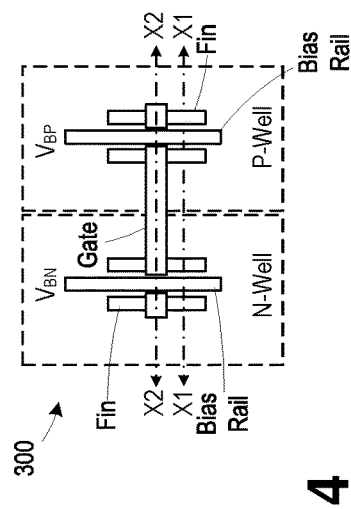
Figure 14:
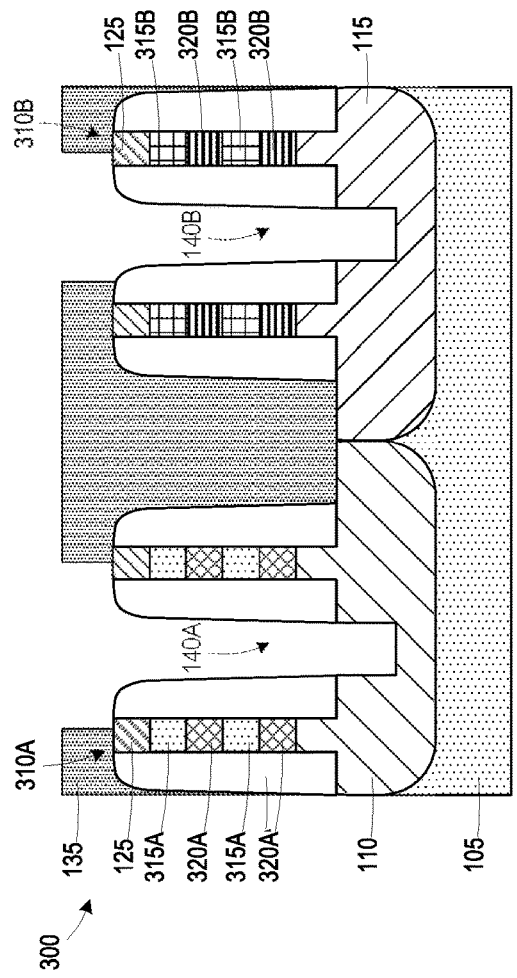

Referring to FIG. 14, a patterned mask layer 135 is formed over the hard mask layer 125, the fins 310A, 310B, and the sidewall spacers 130A, 130B, in accordance with some embodiments. In some embodiments, a trench 140A is formed in the N-well region 110 using the patterned mask layer 135 as an etch template, and a trench 140B is formed in the P-well region 115 using the patterned mask layer 135 as an etch template. In some embodiments, the sidewall spacers 130A, 130B are further used as an etch template during the etch process to form the trenches 140A, 140B. In some embodiments, such as where the patterned mask layer 135 exposes portions of the hard mask layer 125, the hard mask layer 125 also acts as part of the etch template. In some embodiments, the patterned mask layer 135 comprises photoresist. In some embodiments, the sidewall spacers 130A, 130B serve to self-align the etch process when forming the trenches 140A, 140B.

Figure 15:
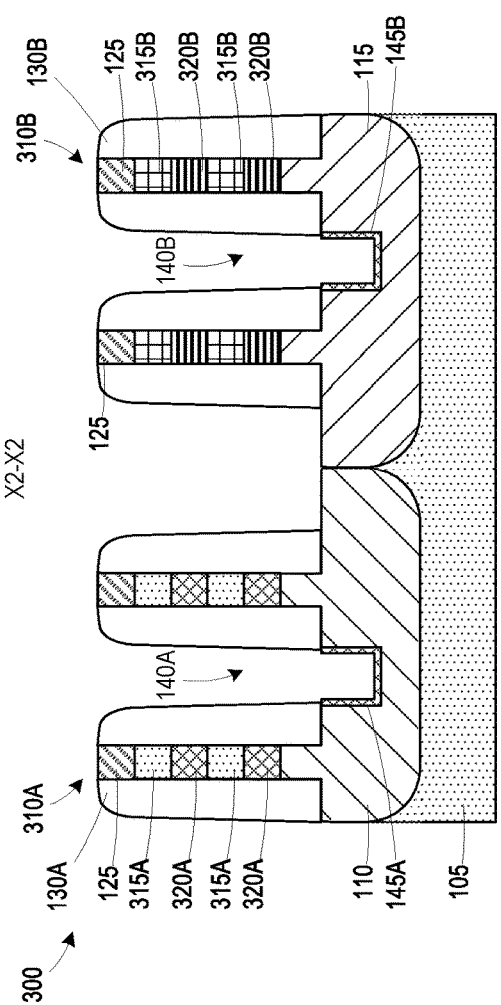

Referring to FIG. 15, the patterned mask layer 135 is removed and liner layers 145A, 145B are formed in the trenches 140A, 140B, in accordance with some embodiments. In some embodiments, the liner layers 145A, 145B comprise metal seed layers, interface layers, adhesion layers, barrier layers, etc., or combinations of these layers. In some embodiments, the liner layers 145A, 145B comprise conductive layers, such as TiN, WN, TaN, Ru, W, Cu, Ti, Al, TiAl, TiAlN, TiAlC, TiAlCN, TaC, TaCN, TaSiN, Mn, Zr, or other suitable materials. In some embodiments, the liner layers 145A, 145B are formed in the trenches 140A, 140B by depositing a conformal layer of the material of the liner layers 145A, 145B over the semiconductor arrangement 300 and performing an etch process to remove portions of the conformal layer not positioned in the trenches 140A, 140B. In some embodiments, the liner layers 145A, 145B have a same material composition. In some embodiments, the material composition of the liner layer 145A is different than the material composition of the liner layer 145B. In some embodiments, where the liner layer 145A comprises a metal, the liner layer 145A and the N-well region 110 form a Schottky diode, with the liner layer 145A functioning as one of an anode or a cathode and the N-well region 110 functioning as the other of the anode or the cathode. In some embodiments, an interface where the liner layer 145A contacts the N-well region 110 may be referred to as a Schottky barrier. In some embodiments, where the liner layer 145B comprises a metal, the liner layer 145B and the P-well region 115 form a Schottky diode, with the liner layer 145B functioning as one of an anode or a cathode and the P-well region 115 functioning as the other of the anode or the cathode. In some embodiments, an interface where the liner layer 145B contacts the P-well region 115 may be referred to as a Schottky barrier.

In some embodiments, the liner layers 145A, 145B comprise silicide layers. In some embodiments, the silicide layers are formed by depositing a conformal layer of a refractory metal over the semiconductor arrangement 300 and performing an etch process to remove portions of the conformal layer not positioned in the trenches 140A, 140B. In some embodiments, the refractory metal comprises nickel, platinum, cobalt, or other suitable material. In some embodiments, different refractory metals are selected for each of the trenches 140A, 140B. In some embodiments, an annealing process is performed to cause the refractory metal to react with underlying silicon-containing material to form a metal silicide, and an etch process is performed to remove unreacted portions of the layer of refractory metal. In some embodiments, an additional annealing process is performed to form the final phase of the metal silicide. In some embodiments, the silicide formation process consumes some of the material of the semiconductor layer 105. In some embodiments, the liner layers 145A, 145B or precursors of the liner layers 145A, 145B are formed by a chemical vapor deposition (CVD) process, an atomic layer deposition (ALD) process, a physical vapor deposition (PVD) process, a plating process, an electroless plating process, or other suitable process.

Figure 16:
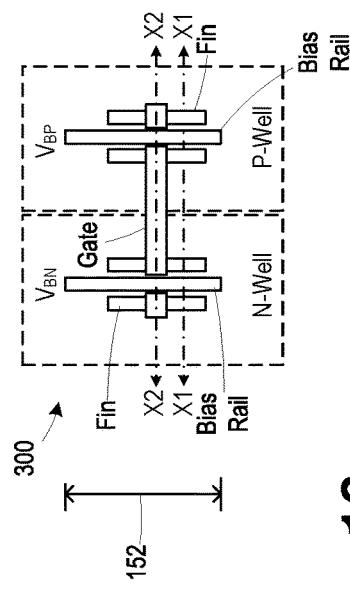
Figure 16:
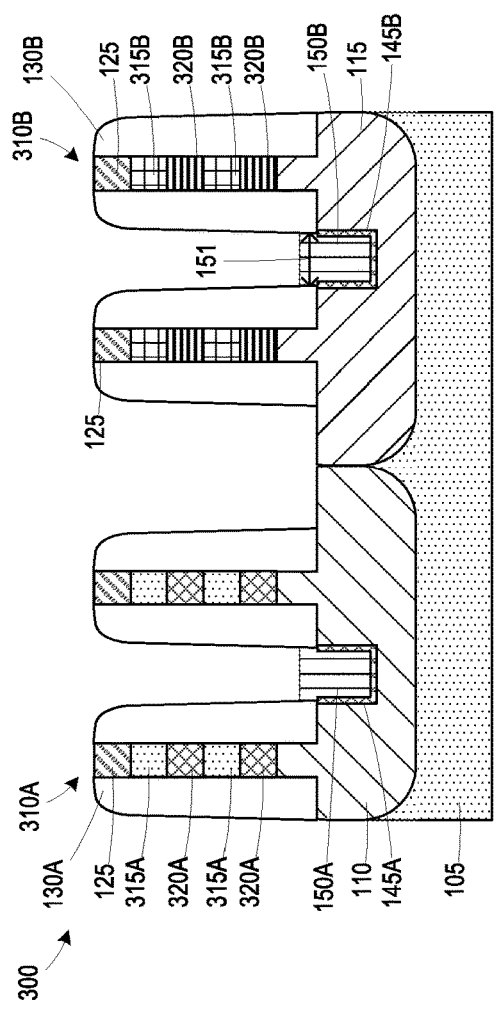

Referring to FIG. 16, conductive lines 150A, 150B are formed in the trenches 140A, 140B, in accordance with some embodiments. In some embodiments, at least a portion of a sidewall of the first conductive line 150A is in conductive contact with a sidewall of the N-well region 110, and at least a portion of a sidewall of the second conductive line 150B is in conductive contact with a sidewall of the P-well region 115. In some embodiments, the conductive lines 150A, 150B are formed by depositing a conductive layer over the semiconductor arrangement 300 and performing an etch process to recess the conductive material. In some embodiments, the conductive material comprises tungsten, aluminum, copper, cobalt, or another suitable material. In some embodiments, the conductive material is formed by a CVD process, an ALD process, a PVD process, a plating process, an electroless plating process, or other suitable process. In some embodiments, a portion of at least one of the conductive lines 150A, 150B extends beyond the trenches 140A, 140B such that a top surface of the at least one the conductive lines 150A, 150B is above a top surface of the semiconductor layer 105. In some embodiments, at least one of the conductive lines 150A, 150B is recessed relative to the top surface of the semiconductor layer 105 such that the top surface of the at least one of the conductive lines 150A, 150B is below the top surface of the semiconductor layer 105. In some embodiments, the top surface of at least one of the conductive lines 150A, 150B is coplanar with the top surface of the semiconductor layer 105. In some embodiments, the conductive lines 150A, 150B have a width 151 of about 5-100 nm. In some embodiments, a bottom surface of at least one of the conductive lines 150A, 150B is spaced apart from a top surface of the semiconductor layer 105 by about 0-200 nm. In some embodiments, the conductive lines 150A, 150B have a length 152 of about 100-1000 nm. In some embodiments, a portion of the first conductive line 150A at least partially overlies the liner layer 145A. In some embodiments, a portion of the second conductive line 150B at least partially overlies the liner layer 145B.

Figure 17:
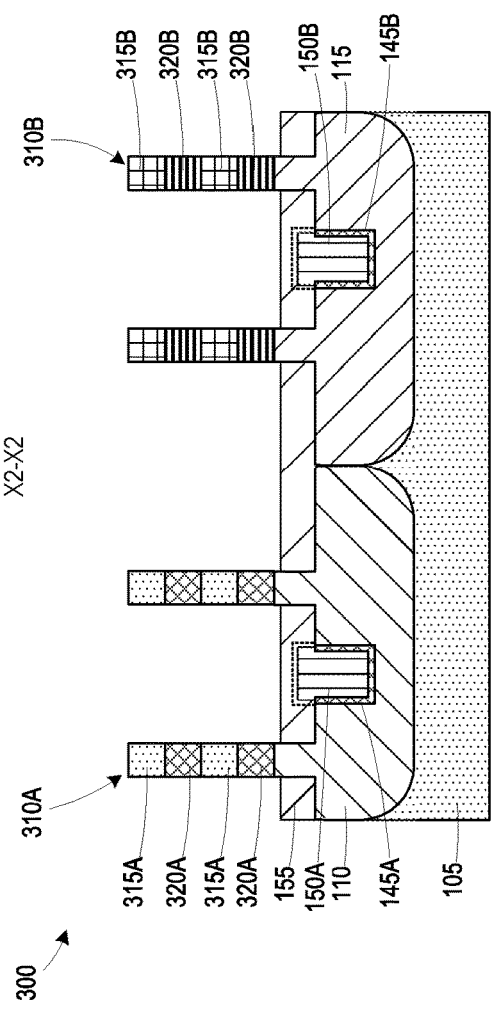

Referring to FIG. 17, the hard mask layer 125 and the sidewall spacers 130A, 130B are removed and an isolation structure 155, such as a shallow trench isolation (STI), is formed between the fins 310A, 310B, in accordance with some embodiments. In some embodiments, an etch process is performed to remove the hard mask layer 125 and the sidewall spacers 130A, 130B. In some embodiments, the isolation structure 155 is formed by depositing a dielectric layer between the fins 310A, 310B and recessing the dielectric layer by performing an etch process to expose at least portions of the sidewalls of the fins 310A, 310B that were concealed when the dielectric layer was deposited. In some embodiments, the isolation structure 155 comprises silicon and oxygen. In some embodiments, a barrier layer 160 (shown in phantom in FIG. 17, but not repeated in the subsequent Figures) is formed over the exposed portion of the conductive lines 150A, 150B prior to forming the isolation structure 155. In some embodiments, the use of the barrier layer 160 depends on the material of the conductive lines 150A, 150B and the material of the isolation structure 155. In some embodiments, the barrier layer 160 is deposited over the semiconductor arrangement 300 and an etch process is performed to remove portions of the barrier layer 160 not positioned on the conductive lines 150A, 150B.

Figure 18:
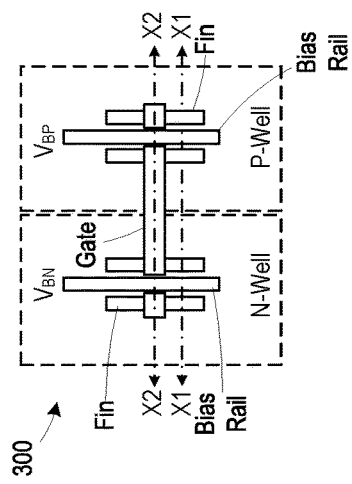
Figure 18:
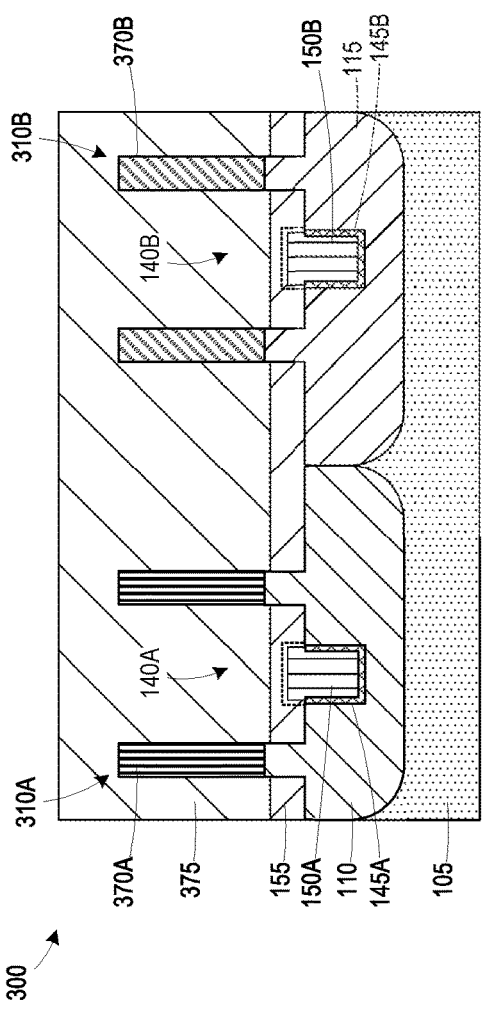
Figure 18:
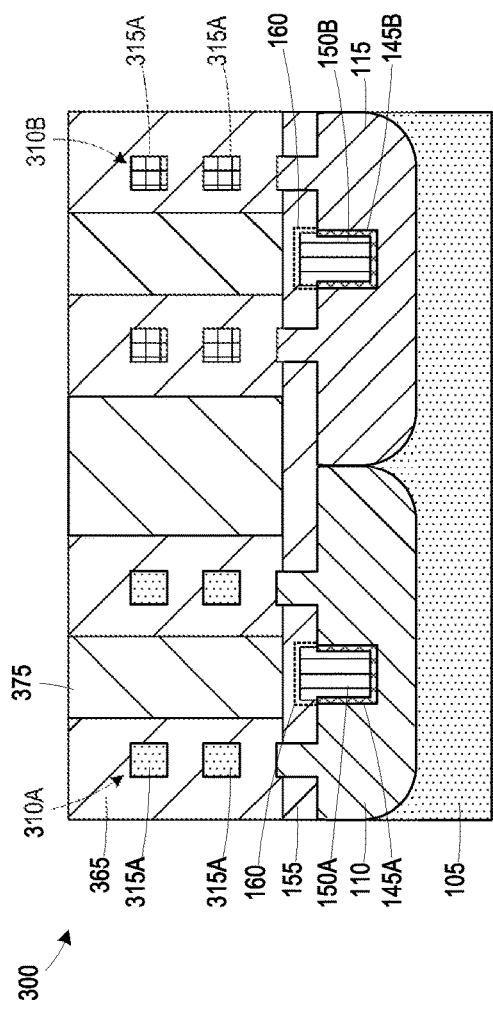

Referring to FIG. 18, gate structures 365 are formed over a portion of the fins 310A, 310B, such as over a channel portion of the fins 310A, 310B, and over the isolation structure 155, in accordance with some embodiments. In some embodiments, the active semiconductor material layers 315A, 315B and sacrificial semiconductor layers 320A, 320B are replaced with doped source/drain regions 370A, 370B. In some embodiments, an etch process is performed to remove the active semiconductor material layers 315A, 315B and sacrificial semiconductor layers 320A, 320B in the source/drain regions, and the doped source/drain regions 370A, 370B are epitaxially grown. In some embodiments, the doped source/drain regions 370A comprise a P-type dopant. In some embodiments, the doped source/drain regions 370B comprise an N-type dopant.

In some embodiments, the gate structures 365 comprise a gate dielectric layer and a gate electrode (not separately shown). In some embodiments, the gate dielectric layer comprises a high-k dielectric material. According to some embodiments, the gate structures 365 are formed by forming sacrificial gate structure over the fins 310A, 310B and the isolation structure 155 and forming a dielectric layer 375 over the sacrificial gate structures. In some embodiments, sacrificial gate structures are replaced with a gate structures 365 comprising a replacement gate dielectric layer and a gate electrode. In some embodiments, the sacrificial gate structures are removed to define gate cavities in the dielectric layer 375, and the sacrificial semiconductor layers 320A, 320B are removed in the channel regions exposed in the gate cavities. In some embodiments, the replacement gate dielectric layer and the gate electrode wrap around the active semiconductor material layers 315A, 315B. In some embodiments, front side or backside contacts are formed to contact the conductive lines 150A, 150B, as illustrated in FIGS. 10 and 11 and discussed above.

In some embodiments, the presence of the conductive lines 150A, 150B reduces the resistance between the doped source/drain region 370A and the N-well region 110 and between the doped source/drain region 370B and the P-well region 115. In semiconductor devices, a latch-up can occur when a low-impedance path is created between the $V_{DD}$ and $V_{SS}$ rails due to interaction of parasitic PNP and NPN bipolar transistors that form a silicon-controlled rectifier with positive feedback that can short circuit the power rail and the ground rail. In some embodiments, reducing the well resistance by providing a liner layer between the well regions 110, 115 and the conductive lines 150A, 150B reduces the likelihood of a latch-up condition occurring. In some embodiments, the presence of the liner layers 145A, 145B between the well regions 110, 115 and the conductive lines 150A, 150B obviate the need for pickup cells to connect voltage sources to the N-well region 110 and the P-well region 115, resulting in a reduced cell area.

According to some embodiments, a semiconductor arrangement is provided. The semiconductor arrangement includes a well region, a transistor over the well region, a conductive line having a sidewall in conductive contact with a sidewall of the well region, and a liner layer disposed between the sidewall of the conductive line and the sidewall of the well region. The conductive line is further in conductive contact with a first source/drain region of the transistor.

According to some embodiments, a semiconductor arrangement is provided. The semiconductor arrangement includes a first well region including a first type of dopant and a second well region abutting the first well region and including a second type of dopant different than the first type of dopant. The semiconductor arrangement also includes a first cell configured to perform a logic function. The first cell includes a first transistor over the first well region and a second transistor over the second well region. A first liner layer is at least partially embedded in the first well region at a cell boundary of the first cell and a second cell, and a first conductive line overlies the first liner layer and is separated from the first well region by the first liner layer. The first conductive line is electrically coupled to the first transistor.

According to some embodiments, a method is provided. The method includes forming a well region in a semiconductor layer. A first fin and a second fin are formed over the well region. A first spacer is formed on the first fin and a second spacer is formed on the second fin. A portion of the well region positioned between the first spacer and the second spacer is removed to define a trench. A linear layer is formed in the trench, and a conductive line is formed in the trench over the liner layer. The conductive line conductively contacts the well region.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement, comprising:
    a well region;
    a transistor over the well region;
    a conductive line having a sidewall in conductive contact with a sidewall of the well region, wherein the conductive line is further in conductive contact with a first source/drain region of the transistor;
    a liner layer disposed between the sidewall of the conductive line and the sidewall of the well region; and
    a contact extending through the well region and contacting a bottom of the liner layer.

2. The semiconductor arrangement of claim 1, wherein:
    a channel of the transistor is defined in a fin,
    the channel extends in a first direction between the first source/drain region of the transistor and a second source/drain region of the transistor, and
    the conductive line extends in the first direction such that the conductive line extends parallel to the fin.

3. The semiconductor arrangement of claim 1, wherein the liner layer is disposed between a bottom surface of the conductive line and the well region.

4. The semiconductor arrangement of claim 1, comprising:
    an isolation structure disposed between a gate structure of the transistor and the conductive line.

5. The semiconductor arrangement of claim 1, wherein:
a channel of the transistor is defined in a fin, and
the semiconductor arrangement comprises an isolation structure disposed over the conductive line and laterally between the conductive line and the fin.

6. The semiconductor arrangement of claim 1, comprising:
a dielectric spacer between the sidewall of the well region and a sidewall of the contact.

7. The semiconductor arrangement of claim 1, wherein the liner layer comprises a metal.

8. The semiconductor arrangement of claim 1, wherein the liner layer is a silicide layer.

9. The semiconductor arrangement of claim 1, wherein the liner layer directly contacts the sidewall of the conductive line and the sidewall of the well region.

10. The semiconductor arrangement of claim 9, wherein the liner layer directly contacts a bottom surface of the conductive line and a surface of the well region underlying the bottom surface of the conductive line.

11. The semiconductor arrangement of claim 1, comprising:
an isolation structure overlying the conductive line, wherein a gate electrode of the transistor overlies the isolation structure.

12. A semiconductor arrangement, comprising:
a first well region comprising a first type of dopant;
a second well region abutting the first well region and comprising a second type of dopant different than the first type of dopant;
a first cell configured to perform a logic function and comprising:
a first transistor over the first well region; and
a second transistor over the second well region;
a first liner layer at least partially embedded in the first well region at a cell boundary of the first cell and a second cell; and
a first conductive line overlying the first liner layer and separated from the first well region by the first liner layer, wherein the first conductive line is electrically coupled to the first transistor.

13. The semiconductor arrangement of claim 12, wherein a bottom surface of the first conductive line is below a top surface of the first well region.

14. The semiconductor arrangement of claim 12, wherein the first transistor and the second transistor share a common gate electrode.

15. The semiconductor arrangement of claim 14, comprising:
a second liner layer at least partially embedded in the second well region at a cell boundary of the first cell and a third cell spaced apart from the second cell by the first cell; and
a second conductive line overlying the second liner layer and separated from the second well region by the second liner layer, wherein the second conductive line is electrically coupled to the second transistor.

16. A semiconductor arrangement, comprising:
a well region;
a transistor over the well region;
a conductive line having a sidewall in conductive contact with a sidewall of the well region, wherein the conductive line is further in conductive contact with a first source/drain region of the transistor; and
a liner layer disposed between the sidewall of the conductive line and the sidewall of the well region, wherein the liner layer directly contacts the sidewall of the conductive line and the sidewall of the well region.

17. The semiconductor arrangement of claim 16, wherein:
a channel of the transistor is defined in a fin,
the channel extends in a first direction between the first source/drain region of the transistor and a second source/drain region of the transistor, and
the conductive line extends in the first direction such that the conductive line extends parallel to the fin.

18. The semiconductor arrangement of claim 16, wherein the liner layer is disposed between a bottom surface of the conductive line and the well region.

19. The semiconductor arrangement of claim 16, comprising:
an isolation structure disposed between a gate structure of the transistor and the conductive line.

20. The semiconductor arrangement of claim 16, wherein:
a channel of the transistor is defined in a fin, and
the semiconductor arrangement comprises an isolation structure disposed over the conductive line and laterally between the conductive line and the fin.

* * * * *